United States Patent
Aida et al.

(10) Patent No.: US 11,317,530 B2
(45) Date of Patent: Apr. 26, 2022

(54) SUBSTRATE CASE AND ELECTRICAL JUNCTION BOX

(71) Applicant: Sumitomo Wiring Systems, Ltd., Yokkaichi (JP)

(72) Inventors: Kouki Aida, Yokkaichi (JP); Yoshinao Tsujiya, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 17/011,063

(22) Filed: Sep. 3, 2020

(65) Prior Publication Data

US 2021/0068290 A1 Mar. 4, 2021

(30) Foreign Application Priority Data

Sep. 3, 2019 (JP) .............................. JP2019-160170

(51) Int. Cl.
*H05K 7/14* (2006.01)
*H02G 3/08* (2006.01)
*H05K 5/00* (2006.01)
*B60R 16/02* (2006.01)

(52) U.S. Cl.
CPC ............. *H05K 7/1417* (2013.01); *H02G 3/08* (2013.01)

(58) Field of Classification Search
CPC ...... H02G 3/08; H05K 7/1418; H05K 7/1401; H05K 7/14; H05K 7/1461; H05K 7/1417; H05K 5/0065
See application file for complete search history.

(56) References Cited

U.S. PATENT DOCUMENTS

| | | | | |
|---|---|---|---|---|
| 6,178,094 B1* | 1/2001 | Hakozaki | ............. | H05K 7/1418 16/95 R |
| 6,761,320 B1* | 7/2004 | Chen | .................... | G06K 7/0047 235/492 |
| 8,635,763 B2* | 1/2014 | Zadesky | ............... | H04M 1/026 29/602.1 |
| 9,200,773 B2 | 12/2015 | Ishikawa | | |
| 2007/0020981 A1* | 1/2007 | Matsuo | ................ | H05K 5/0039 439/264 |
| 2010/0103633 A1* | 4/2010 | Fujimura | ............. | H05K 7/1418 361/756 |
| 2010/0315792 A1* | 12/2010 | Jones | ................... | H05K 5/0065 361/753 |

(Continued)

*Primary Examiner* — Hoa C Nguyen
*Assistant Examiner* — Amol H Patel
(74) *Attorney, Agent, or Firm* — Honigman LLP

(57) ABSTRACT

A substrate case can be used in common with different types of substrates, and thus reduces production costs. A substrate case is tubular and has a bottom that includes an open portion into which a first substrate and a second substrate that has a different size can be selectively inserted. Guide portions are configured to guide movement of the first substrate and the second substrate in an insertion direction when the first substrate and the second substrate are selectively inserted through the open portion. A first restricting portion is configured to restrict movement of the first substrate when the first substrate has been guided by the guide portion and inserted to a regular position; and a second restricting portion that is configured to restrict movement of the second substrate when the second substrate has been guided by the guide portion and inserted to the regular position.

15 Claims, 10 Drawing Sheets

(56) References Cited

U.S. PATENT DOCUMENTS

2019/0200473 A1\* 6/2019 Miura .................. H05K 7/1464
2020/0015379 A1\* 1/2020 Fukuda .................... H05K 7/14
2021/0025511 A1\* 1/2021 Chen ...................... H02K 11/33

\* cited by examiner

SUBSTRATE CASE AND ELECTRICAL JUNCTION BOX

CROSS-REFERENCE TO RELATED APPLICATIONS

This claims priority of Japanese Patent Application No. JP 2019-160170 filed on Sep. 3, 2019, the contents of which are incorporated herein.

TECHNICAL FIELD

The present specification discloses a technique that relates to a substrate case and an electrical junction box.

BACKGROUND

Techniques of accommodating substrates in electrical junction box cases are conventionally known. A case described in JP 2013-252793A includes a body portion that has a flattened rectangular parallelepiped shape, and a lid portion that covers an opening of the body portion. A substrate, which has an electronic component mounted thereon, is inserted through an opening of the body portion along a substrate guide of an internal wall of the body portion and the substrate is thus accommodated in an accommodation space in the body portion, after which the lid portion is fitted over the opening and fixed to the body portion.

Electrical junction boxes that are installed in vehicles such as automobiles are required to have different functions depending on the types of vehicles and the apparatuses they are used with. For this reason, depending on the functions required of an electrical junction box, there are cases in which a standard substrate that constitutes a standard circuit is accommodated in an electrical junction box, and cases in which an extended substrate that has more functions than the standard substrate is accommodated in an electrical junction box. Here, the size of the standard substrate and the extended substrate must be changed in order to reduce unneeded substrate surface area and reduce costs. However, a problem with changing the sizes of substrates is that if the sizes of the substrates are changed, a plurality of types of cases may be necessary according to the sizes of the substrates, which may increase the types of cases required and thus increase production costs.

SUMMARY

With the technique described in the present specification, a substrate case that is tubular and has a bottom includes: an open portion into which a first substrate and a second substrate that has a different size to the first substrate can be selectively inserted; a guide portion that is configured to guide movement of the first substrate and the second substrate in an insertion direction when the first substrate and the second substrate are selectively inserted through the open portion; a first restricting portion that is configured to restrict movement of the first substrate when the first substrate has been guided by the guide portion and inserted to a regular position; and a second restricting portion that is configured to restrict movement of the second substrate when the second substrate has been guided by the guide portion and inserted to the regular position.

Effects of the Disclosure

The technique described in the present specification makes it possible to provide a substrate case that can be commonly used with substrates of different sizes, and thus reduce production costs.

DETAILED DESCRIPTION OF PREFERRED EMBODIMENTS

Embodiments of the Present Disclosure

Figure 1:
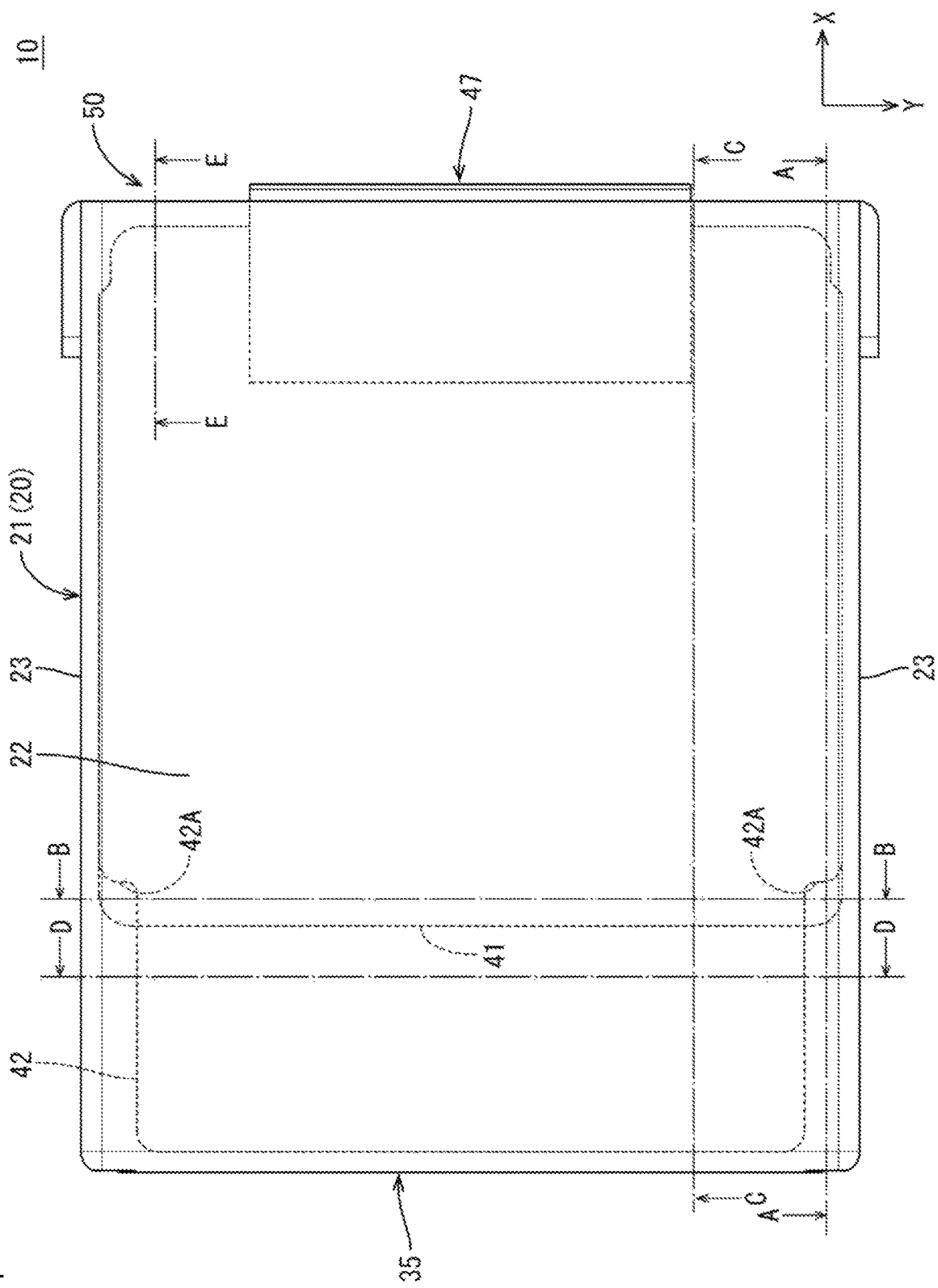
FIG. 1 is a plan view showing an electrical junction box of a first embodiment.

First, embodiments of the present disclosure will be listed and described.

A substrate case of the present disclosure is a substrate case that is tubular and has a bottom, and includes: an open portion into which a first substrate and a second substrate that has a different size to the first substrate can be selectively inserted; a guide portion that is configured to guide movement of the first substrate and the second substrate in an insertion direction when the first substrate and the second substrate are selectively inserted through the open portion; a first restricting portion that is configured to restrict movement of the first substrate when the first substrate has been guided by the guide portion and inserted to a regular position; and a second restricting portion that is configured to restrict movement of the second substrate when the second substrate has been guided by the guide portion and inserted to the regular position.

The configuration described above makes it possible to selectively accommodate the first substrate and the second substrate, which have different sizes, in a common case. This makes it possible to reduce the number of types of substrate cases and reduce production costs.

At least one of the first restricting portion and the second restricting portion includes a pressing protrusion that is configured to press against a board surface of the first substrate or the second substrate when the first substrate or the second substrate have been inserted to the regular position.

This configuration makes it possible to position the first substrate or the second substrate in the regular position inside the substrate case.

The first restricting portion includes a step portion that protrudes in a step-wise manner from an inner surface of the substrate case and is configured to restrict movement of the first substrate in the insertion direction.

This makes it possible to restrict the movement of the first substrate with a simple configuration.

The guide portion includes a pair of groove walls between which an edge portion of the substrate is to be inserted, and a gap between the pair of groove walls is narrower on a side distant from the open portion.

This configuration makes it easy to insert the first substrate and the second substrate, and easy to position the substrates in the regular position.

The guide portion includes a first guide portion that is configured to guide the first substrate and the second substrate in the insertion direction, and a second guide portion that is arranged on a side of the first guide portion opposite to the open portion and is configured to guide the second substrate in the insertion direction.

This configuration makes it possible to improve the accuracy with which the second substrate is guided, compared to a configuration in which a second guide portion is not provided.

A pair of opposing walls that are arranged along a board surface of the first substrate or the second substrate and oppose each other, and a pair of side walls that connect the pair of opposing walls, wherein the surface area of the open portion is smaller than the surface area of the opposing walls.

Decreasing the surface area of the open portion suppresses the intrusion of dust and the like through the open portion, but it becomes necessary to slidably insert the substrate in a direction along the board surface of the substrate when the substrate is to be inserted, and therefore it is difficult to selectively accommodate the first substrate and the second substrate, and to restrict the movement thereof. With the configuration described above, even if the surface area of the open portion is small, the first restricting portion and second restricting portion make it possible to restrict the movement of the selectively accommodated first substrate and second substrate.

An electrical junction box comprising the substrate case, the first substrate or the second substrate that are configured to be accommodated in the substrate case, and a cover that closes the open portion.

The cover includes a guide groove portion that is configured to abut against the first substrate or the second substrate such that movement of the cover in an attachment direction is guided.

In this way, it is possible to easily perform the tasks of attaching the cover and positioning the first substrate or the second substrate.

The following will describe specific examples of the present disclosure with reference to the drawings. Note that the present disclosure is not limited by these examples, but rather by the scope of the claims, and is intended to encompass all modifications within the meanings and scope that are equivalent to the claims.

Embodiment

The present embodiment will be described with reference to FIGS. 1 to 10. An electrical junction box 10 may be installed in a vehicle such as an electric automobile or a hybrid automobile. The following will be described with the X direction and the Y direction in FIG. 1 being forward and leftward respectively, and the Z direction in FIG. 3 being upward.

As shown in FIG. 1, the electrical junction box 10 includes a substrate case 20, a first substrate 41 or a second substrate 42 that can be selectively accommodated in the substrate case 20, and a cover 50 that is fitted to a front end portion of the substrate case 20.

Figure 9:
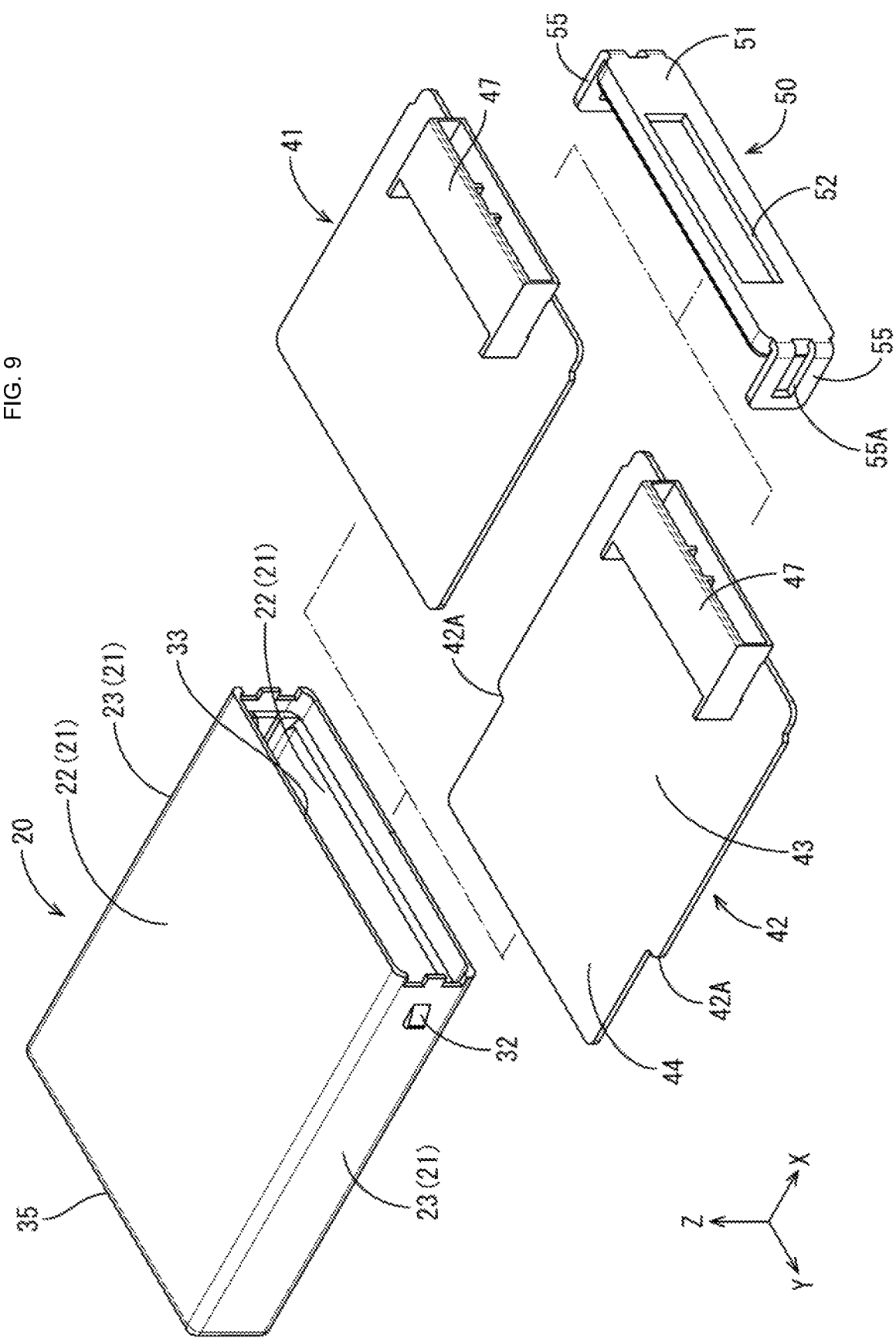
FIG. 9 is an exploded perspective view of the electrical junction box.

The substrate case 20 is made of a synthetic resin and includes a flattened, rectangular-tube shaped rectangular tube portion 21, and a closing wall 35 that closes the rearward side (the other side) of the rectangular tube portion 21. As shown in FIG. 9, the rectangular tube portion 21 includes a pair of flat plate-shaped opposing walls 22, and a pair of flat plate-shaped side walls 23 that connect the pair of opposing walls 22, and the front end portion of the rectangular tube portion 21 forms an open portion 33 that is open in the forward direction. The open portion 33 has a rectangular shape large enough to allow insertion of the first substrate 41 and the second substrate 42, which have a connector 47 and an electronic component (not shown) mounted thereon.

Figure 2:
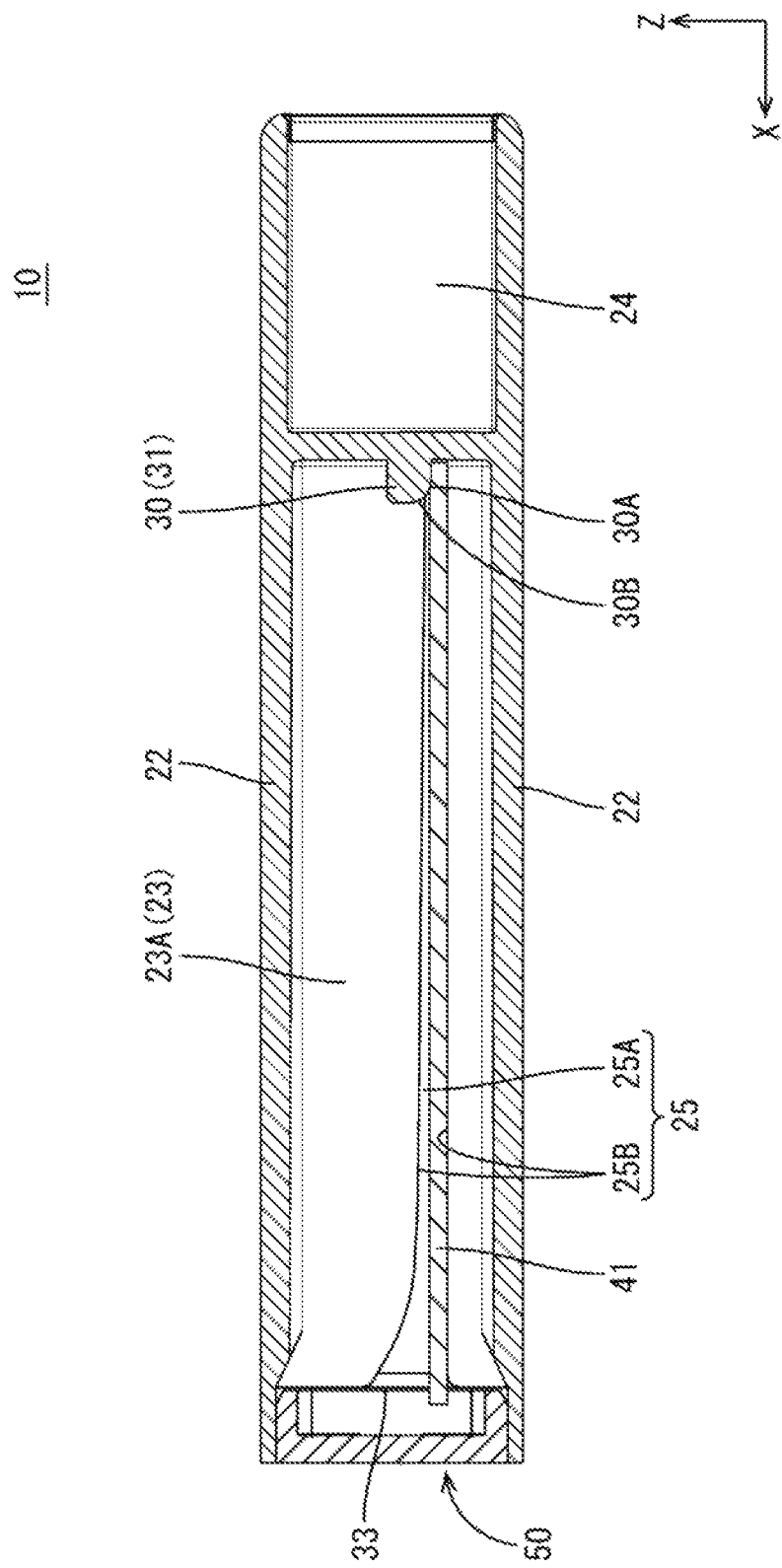
FIG. 2 is a sectional view of the electrical junction box in which a first substrate is accommodated, taken at position A-A in FIG. 1.
Figure 3:
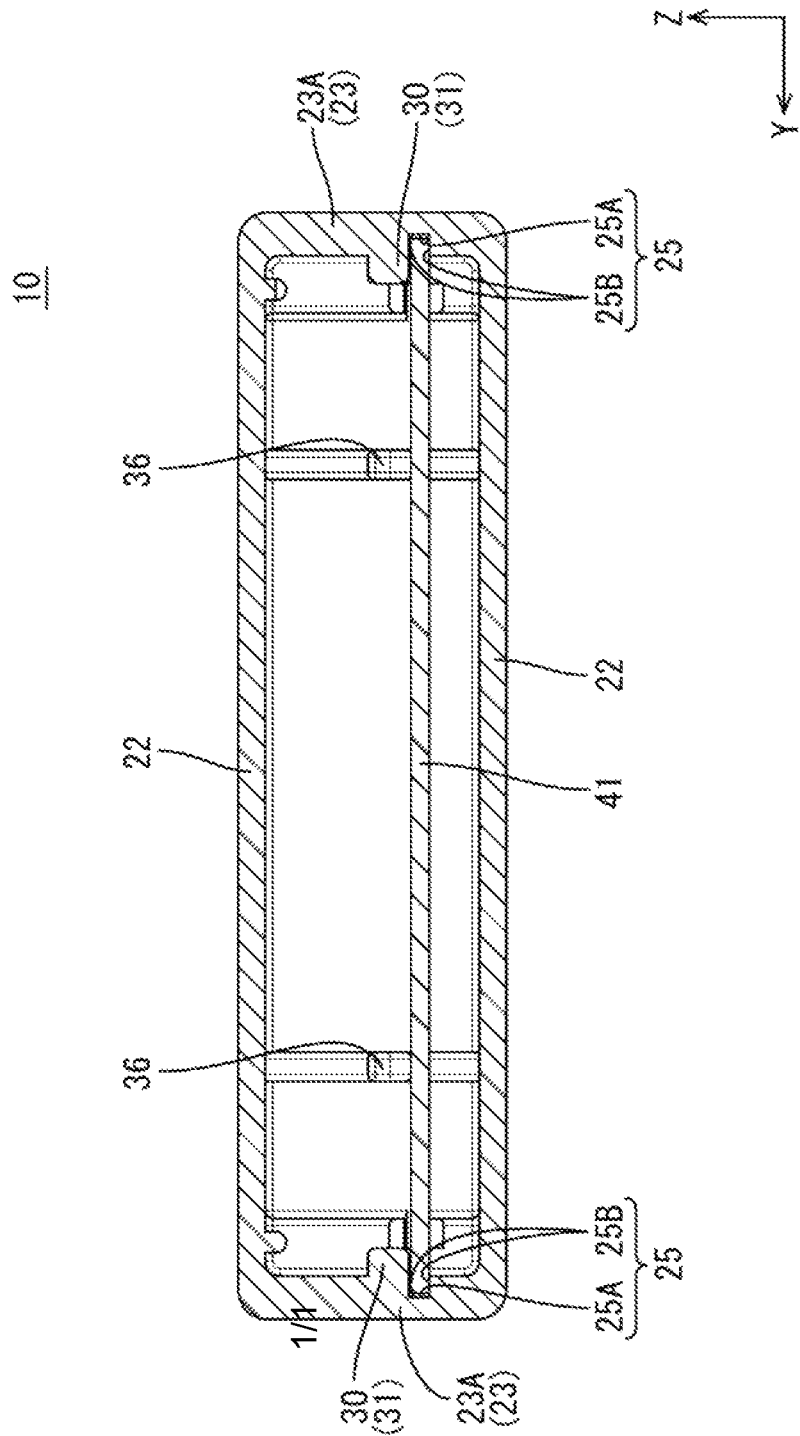
FIG. 3 is a sectional view of the electrical junction box in which the first substrate is accommodated, taken at position B-B in FIG. 1.
Figure 4:
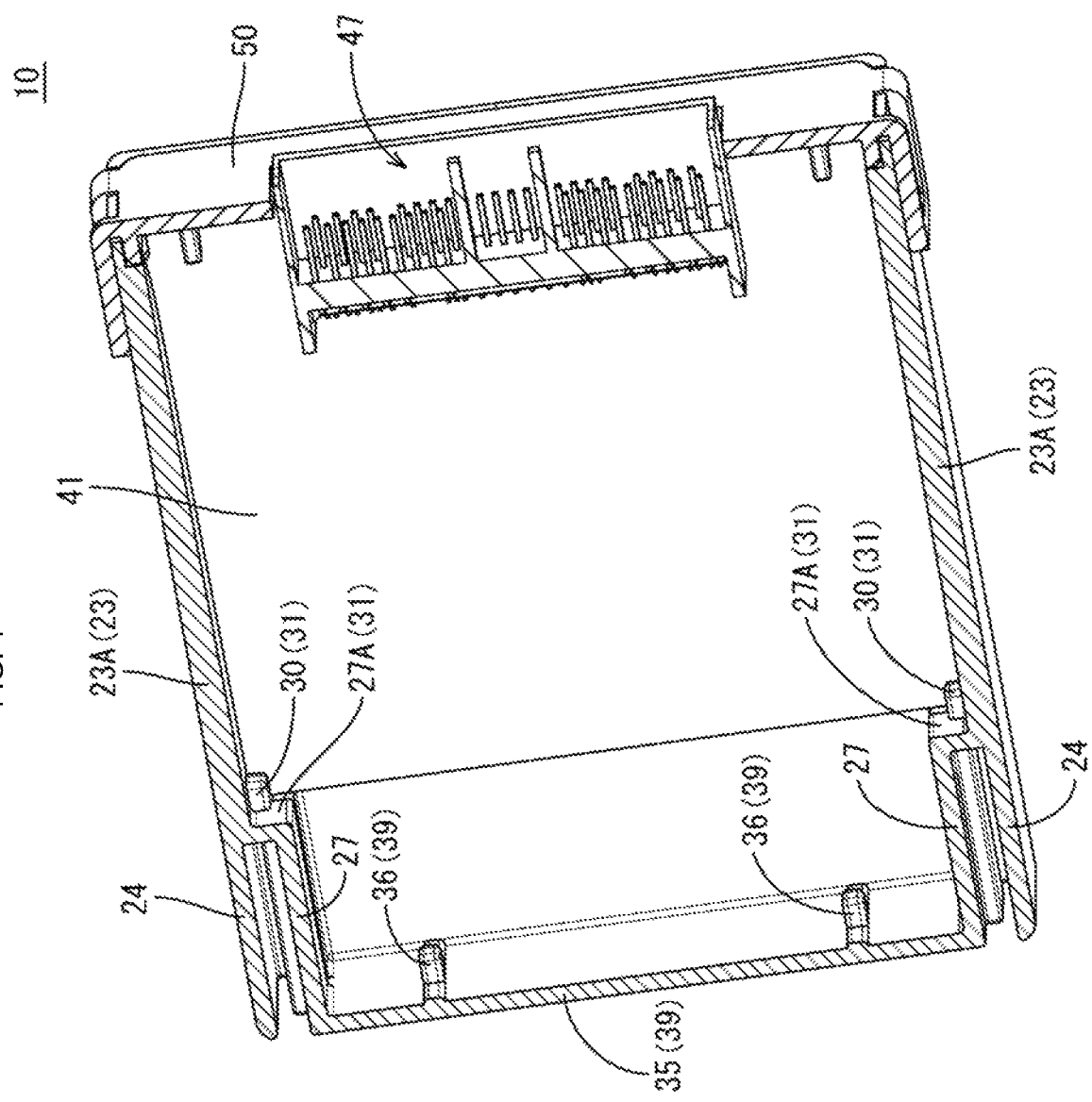
FIG. 4 is a perspective view showing a plane cross section of the electrical junction box in which the first substrate is accommodated.
Figure 10:
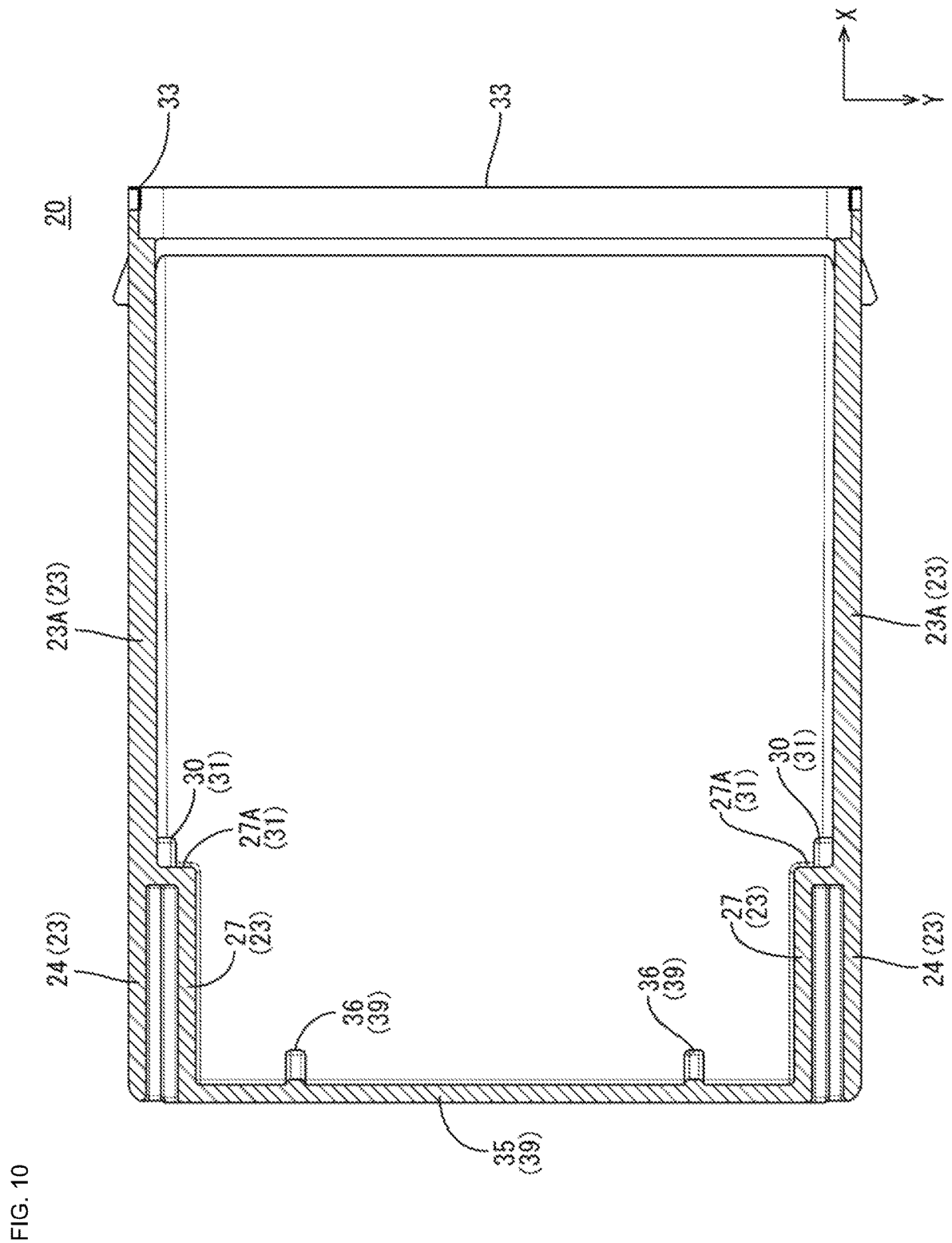
FIG. 10 is a plane cross sectional view showing a substrate case.

The pair of opposing walls 22 and the pair of side walls 23 are all shaped as a rectangular board that is long in the front-rear direction. The surface areas of the board-surfaces of the side walls 23 (and the closing wall 35) are smaller than those of the opposing walls 22. As shown in FIG. 10, the side walls 23 include side wall bodies 23A, outer wall portions 24 that are continuous with the side wall bodies 23A in the rearward direction, and inner wall portions 27 that are arranged inward of the outer wall portions 24 at a set distance therefrom. The outer surfaces of the outer wall portions 24 are continuous as a single surface with the outer surfaces of the side wall bodies 23A. The outer wall portions 24 and the inner wall portions 27 extend parallel to each other. As shown in FIGS. 2 and 3, the inner surfaces of the side wall bodies 23A in the side walls 23 are provided with first guide portions 25 that extend in the front-rear direction and enable the side edge portions of the first substrate 41 and the second substrate 42 to be guided in the direction in which the first substrate 41 and the second substrate 42 are to be inserted. Each of the first guide portions 25 includes a groove base 25A, and a pair of groove walls 25B that extend perpendicular from the groove base 25A and are arranged opposing each other. The lower portion of the groove walls 25B extends in a level plane, and the upper portion of the groove walls 25B is inclined so as to extend upward towards the open portion 33. This means that the space between the pair of groove walls 25B is larger at the front end side (the open portion 33 side) and becomes narrower towards the rearward side. Note that the space between the pair of groove walls 25B in the rear end portion of the first guide portion 25 is slightly larger than the thicknesses of the first substrate 41 and the second substrate 42 (meaning that there is a clearance with the first substrate 41, and a clearance with the second substrate 42).

Figure 5:
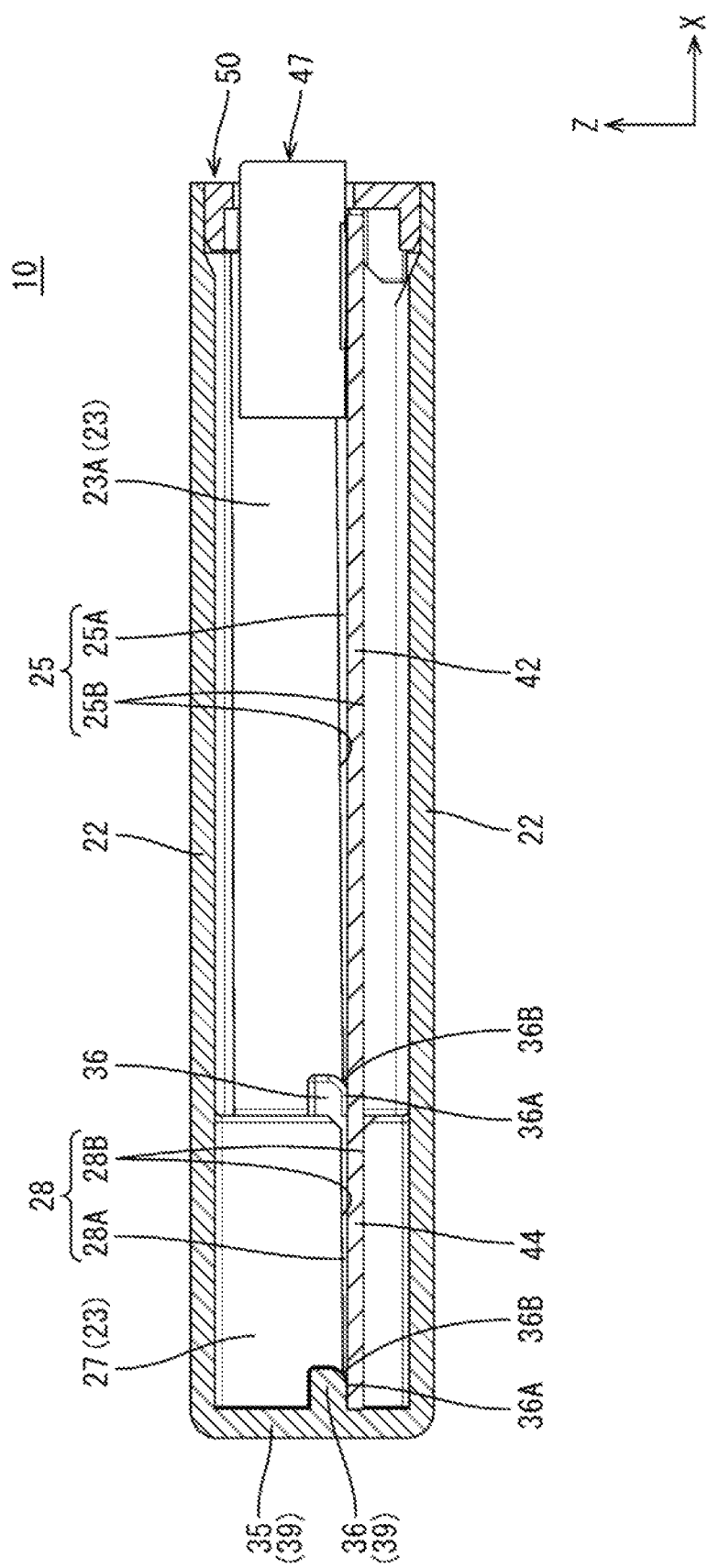
FIG. 5 is a sectional view of the electrical junction box in which a second substrate is accommodated, taken at position C-C in FIG. 1.
Figure 6:
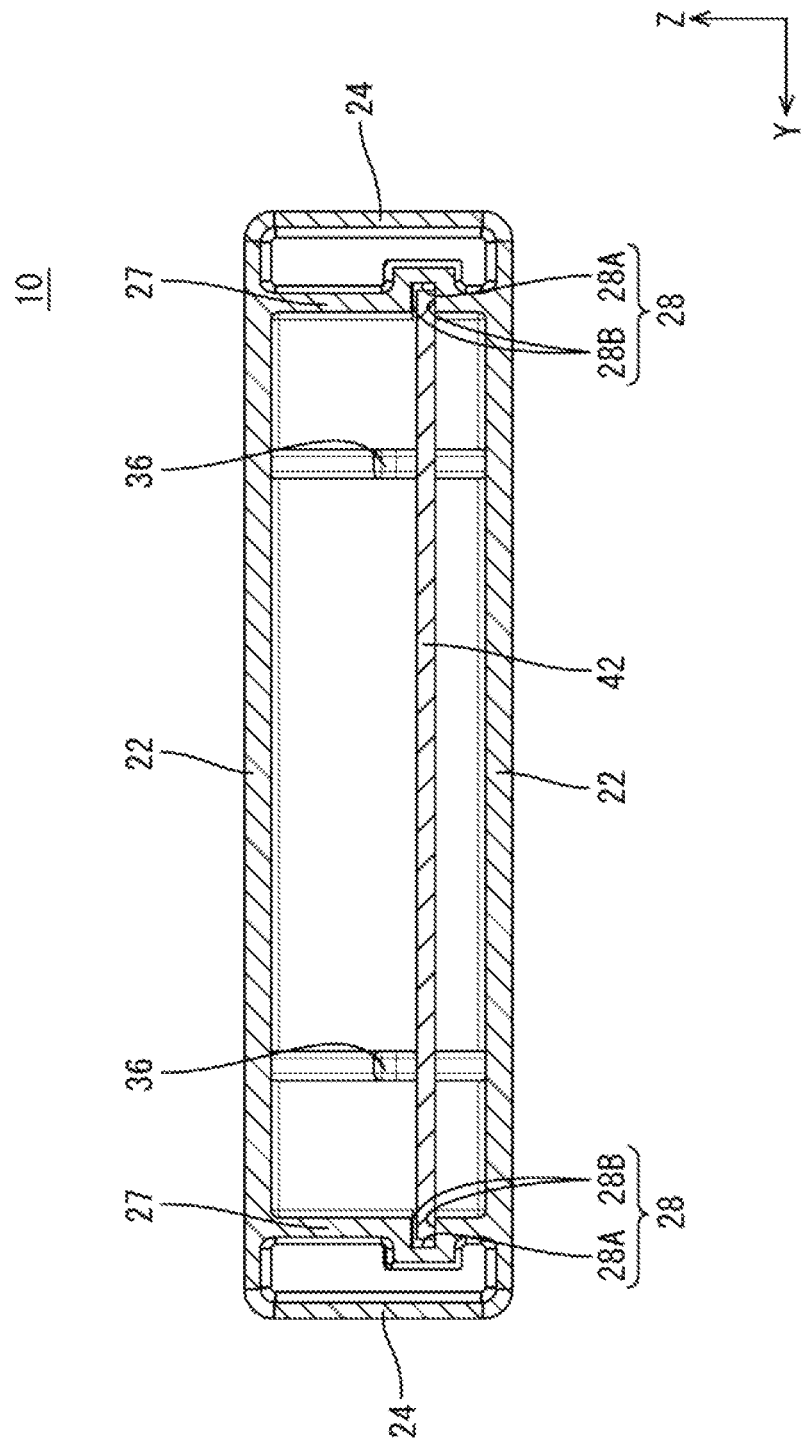
FIG. 6 is a sectional view of the electrical junction box in which the second substrate is accommodated, taken at position D-D in FIG. 1.
Figure 7:
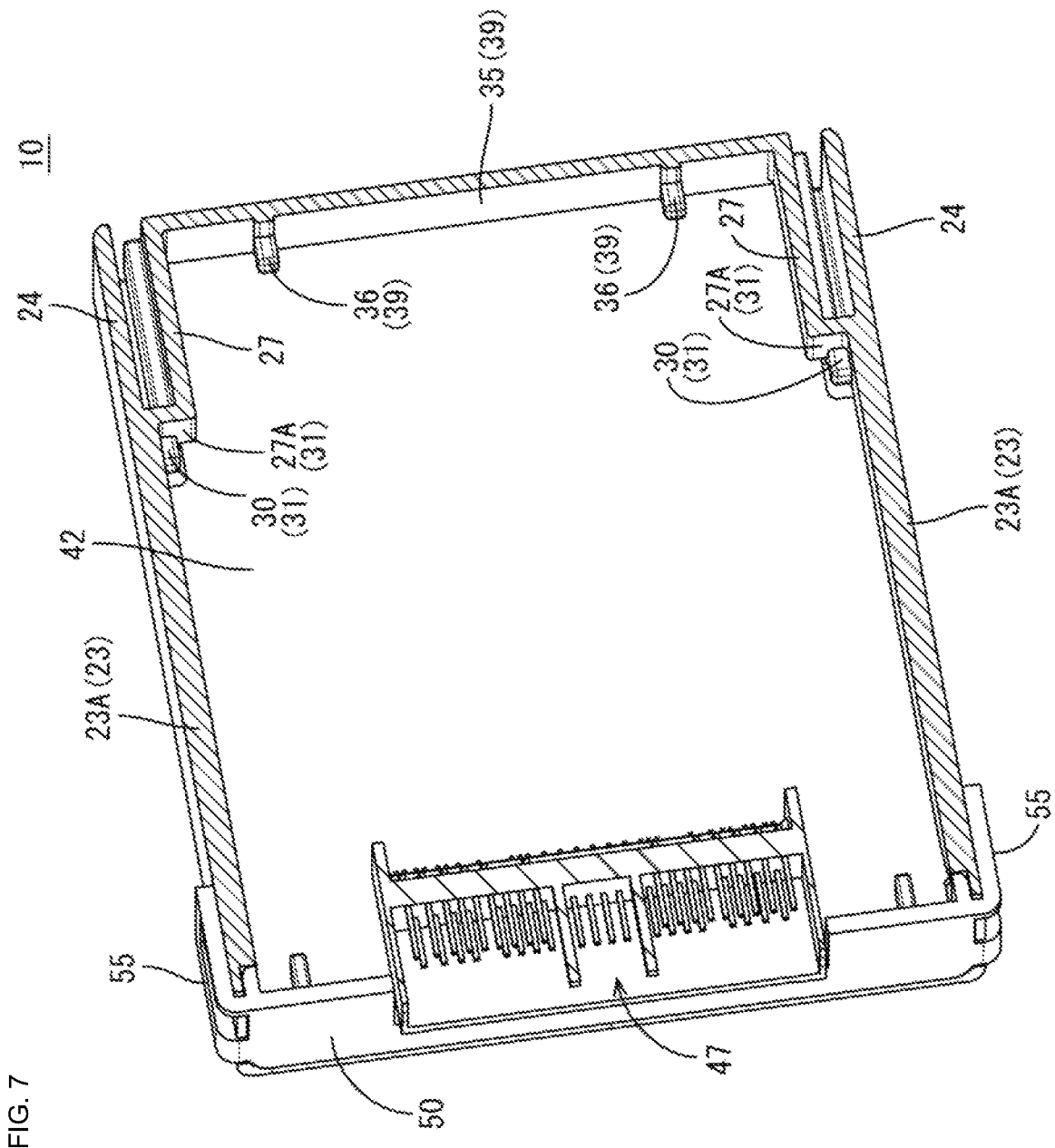
FIG. 7 is a perspective view showing a plane cross section of the electrical junction box in which the second substrate is accommodated.

As shown in FIGS. 5 and 6, the inner surfaces of the inner wall portions 27 in the side walls 23 are provided with second guide portions 28 that extend in the front-rear direction and enable the second substrate 42 to be guided in the direction in which the second substrate 42 is to be inserted. Each of the second guide portions 28 includes a groove base 28A, and a pair of groove walls 28B that extend perpendicular from the groove base 28A and are arranged opposing each other. The lower portion of the pair of groove walls 28B extends in a level plane, and the upper portion of the pair of groove walls 28B is inclined so as to extend upward toward the front side. This means that the space between the pair of groove walls 28B is larger on the front side, and becomes narrower towards the closing wall 35 side.

As shown in FIG. 10, the front end portions of the inner wall portions 27 are provided with step portions 27A that are connected in a step-wise manner to the outer wall portions 24. The step portions 27A restrict the first substrate 41 from moving backwards (in the direction in which the first substrate 41 is inserted) by abutting against corner portions of the first substrate 41 when the first substrate 41 is inserted in the regular position thereof. First pressing protrusions 30 protrude from the corners formed where the step portions 27A and the side wall bodies 23A meet. As shown in FIG. 2, the first pressing protrusions 30 include first pressing surfaces 30A that come into surface contact with the board surface of the first substrate 41, and first inclined surfaces 30B that are inclined towards, and are continuous with, the first pressing surfaces 30A. The first inclined surfaces 30B abut against the rear end portion of the first substrate 41 or the second substrate 42 when the first substrate 41 or the second substrate 42 is inserted, and thus the first substrate 41 or the second substrate 42 is guided towards the first pressing surfaces 30A.

When the side edge portions of the first substrate 41 are inserted into the first guide portions 25, the first substrate 41 can become positionally displaced in the up-down direction within the clearance with the pair of groove walls 28B. According to the present embodiment, the first pressing protrusions 30 press against the upper surface of the corner portions of the first substrate 41, whereby the side edge portions of the first substrate 41 are pressed against the lower portion of the groove walls 25B in a state of surface contact, thus restricting movement thereof in the up-down direction. The rear side of the rear end portion of the first substrate 41 is positioned by the step portions 27A, and the front end portion of the first substrate 41 is positioned by the cover 50. In this way, the first substrate 41 is positioned in the regular position thereof (the position shown in FIG. 2) relative to the substrate case 20. The step portions 27A and the first pressing protrusions 30 serve as a first restricting portion 31 that restricts the first substrate 41 from moving.

As shown in FIG. 10, the closing wall 35 is a portion that closes off the bottom surface of the substrate case 20, and a pair of second pressing protrusions 36 protrude forward from the front surface of the closing wall 35. As shown in FIG. 5, the second pressing protrusions 36 include second pressing surfaces 36A that come into surface contact with the board surface of the first substrate 41, and second inclined surfaces 36B that are inclined towards, and are continuous with, the second pressing surfaces 36A. When the side edge portions of (an extension portion 44 of) the second substrate 42 are inserted into the second guide portions 28, the second substrate 42 can become positionally displaced in the up-down direction within the clearance with the pair of groove walls 28B. With the present embodiment, the second pressing protrusions 36 press against the upper surface of the second substrate 42, whereby the rear end portion of the second substrate 42 is pressed against the lower portion of the groove walls 28B in a state of surface contact, thus restricting movement thereof in the up-down direction. The rear side of the rear end portion of the second substrate 42 is positioned by the closing wall 35, and the front end portion of the second substrate 42 is positioned by the cover 50. In this way, the second substrate 42 is positioned in the regular position thereof (the position shown in FIG. 5) relative to the substrate case 20. A closing wall 35A and the second pressing protrusions 36 serve as a second restricting portion 39 that restricts the second substrate 42 from moving.

As shown in FIG. 9, locking protrusions 32 protrude outward from the front end sides of the outer surfaces of both side walls 23. The locking protrusions 32 protrude outward in a step-wise manner, and the protrusions become smaller in an inclined shape toward the front sides thereof.

The first substrate 41 and the second substrate 42 are both printed substrates that are formed with the use of printed circuit technology in which conduction paths made from copper foil or the like are printed onto insulating boards, and have electronic components and connectors 47 mounted thereon. The first substrate 41 is rectangular and includes circuitry that provides standard functions for controlling electrical automotive components, motors, loads, and the like. The second substrate 42 is rectangular and has a larger board surface area than that of the first substrate 41, and in addition to the standard functions of the first substrate 41, includes circuitry that provides extended functionality for enabling Ethernet (registered trademark) communication for example. The second substrate 42 has a connector 47 mounted thereon, and includes a base portion 43 that constitutes circuitry for standard functionality, and the extension portion 44 that extends rearwards towards the base portion 43 and constitutes circuitry for extended functionality.

The base portion 43 has approximately the same shape as that of the first substrate 41, except that the base portion 43 includes cut-out portions 42A (so that the rear end portion of the base portion 43 is shorter than the first substrate 41) that are cut out so that the base portion 43 does not abut against the step portions 27A. The extension portion 44 is a portion that has a rectangular shape, extends rearward of the base portion 43, and has an electronic component mounted thereon that is necessary for the extended functionality of the second substrate 42. The width of the extension portion 44 is smaller than that of the base portion 43 due to both end portions of the extension portion 44 in the width direction relative to the base portion 43 being removed. The electronic component can be an FET (Field Effect Transistor), a coil, a capacitor, and IC (Integrated Circuit), or the like. Each connector 47 includes a housing that is made from a synthetic resin and into which another corresponding connector can be fitted, and bar-shaped connector terminals that are made of copper, a copper alloy, or the like and are fixed to the housing. The connector terminals are soldered to conduction paths on the surface layer of the substrate.

The cover 50 is made from a synthetic resin and, as shown in FIG. 9, includes a flat plate-shaped cover body 51 that covers the open portion 33 of the substrate case 20, and a pair of locking portions 55 that are respectively provided on two end portions of the cover body 51 and lock to the pair of locking protrusions 32 on the substrate case 20. The cover body 51 is provided with a rectangular insertion hole 52 that passes therethrough and through which the connector 47 mounted onto the first substrate 41 or the second substrate 42 is led to the outside thereof.

Each of the locking portions 55 has a flexible and deformable frame shape in which a locking hole 55A is formed passing therethrough, and when the cover 50 is mounted to the substrate case 20, the locking portions 55 come into contact with the locking protrusions 32 and elastically spread outward, and when the locking protrusions 32 reach the locking holes 55A, the locking portions 55 elastically return and thus lock to the locking protrusions 32.

Figure 8:
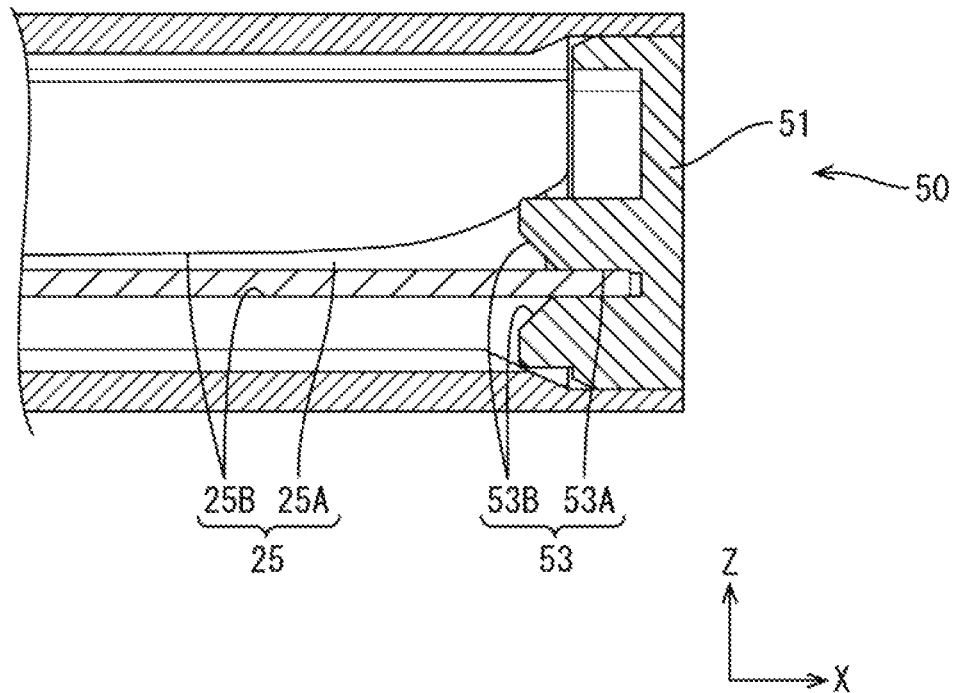
FIG. 8 is a sectional view of the electrical junction box taken at position E-E in FIG. 1.

As shown in FIG. 8, the substrate case 20 side of the cover body 51 is provided with a guide groove portion 53 that positions the front end portion of the first substrate 41 or the second substrate 42 when the cover 50 is attached to the substrate case 20. The guide groove portion 53 includes a sandwiching groove 53A that sandwiches the front end portion of the first substrate 41 or the second substrate 42 therein, and a guide taper 53B that guides the front end portion of the first substrate 41 or the second substrate 42 into the sandwiching groove 53A. The sandwiching groove 53A has a groove width roughly the same as the thickness of the first substrate 41 or the second substrate 42, and the front end portion of the first substrate 41 or the second substrate 42 is fitted into the sandwiching groove 53A. The guide taper 53B leads the front end portion of the first substrate 41 or the second substrate 42 into the sandwiching groove 53A when the cover 50 is attached to the substrate case 20.

The following is a description of how the electrical junction box 10 is assembled.

The electronic component and the connectors 47 may be attached to the first substrate 41 or the second substrate 42 through reflow soldering for example. The rear side end of the first substrate 41 or the second substrate 42 is then inserted into the open portion 33 of the substrate case 20, in accordance with the vehicle in which the electrical junction box 10 is installed. If the first substrate 41 is inserted to the regular position thereof when inserted into the substrate case 20, the corner portions of the rear end portion of the first substrate 41 abut against the step portions 27A of the substrate case 20, and a surface of the first substrate 41 is pressed by the first pressing protrusions 30 (see FIG. 4). On the other hand, if the second substrate 42 is inserted to the regular position thereof when inserted into the substrate case 20, the rear edge portion (rear end portion) of the (extension portion 44 of the) second substrate 42 abuts against the closing wall 35, and a surface of the rear end portion of the second substrate 42 is pressed by the second pressing protrusions 36 (see FIGS. 6 and 7).

Next, the cover 50 is fitted to the substrate case 20 that accommodates the first substrate 41 or the second substrate 42, whereby the front end portion of the first substrate 41 or the second substrate 42 is sandwiched in the guide groove portion 53, and the locking portions 55 are locked to the locking protrusions 32. Thus, the electrical junction box 10 is formed.

According to the present embodiment, the following actions and effects can be observed.

The substrate case 20 that is tubular and has a bottom includes: the open portion 33 into which the first substrate 41 and the second substrate 42 that has a different size to the first substrate 41 can be selectively inserted; the guide portions 25 and 28 that are configured to guide movement of the first substrate 41 and the second substrate 42 in an insertion direction when the first substrate 41 and the second substrate 42 are selectively inserted through the open portion 33; the first restricting portion 31 that is configured to restrict movement of the first substrate 41 when the first substrate 41 has been guided by the guide portion 25 and inserted to a regular position; and the second restricting portion 39 that is configured to restrict movement of the second substrate 42 when the second substrate 42 has been guided by the guide portion 28 and inserted to the regular position.

According to the present embodiment, it is possible to selectively accommodate the first substrate 41 and the second substrate 42, which have different sizes, in a common case. This makes it possible to reduce the number of types of molds used for forming the substrate case 20, and thus mold management becomes easier. It is also possible to suppress the labor involved in selecting the substrate case 20 when assembling the electrical junction box 10. This makes it possible to reduce the number of types of the substrate case 20 and reduce the production costs thereof.

Also, at least one of the first restricting portion 31 and the second restricting portion 39 includes the pressing protrusions 30 and 36 that are configured to press against a board surface of the first substrate 41 or the second substrate 42 when the first substrate 41 or the second substrate 42 have been inserted to the regular position This configuration makes it possible to position the first substrate 41 or the second substrate 42 in the regular position inside the substrate case 20.

Also, the first restricting portion 31 includes the step portion 27A that protrudes in a step-wise manner from an inner surface of the substrate case 20 and is configured to restrict movement of the first substrate 41 in the insertion direction.

This makes it possible to restrict the movement of the first substrate 41 with a simple configuration.

Also, the guide portions 25 and 28 include the pairs of groove walls 28B between which an edge portion of the substrates 41 and 42 is to be inserted, and a gap between the pair of groove walls 28B is narrower on a side distant from the open portion 33.

This configuration makes it easy to insert the first substrate 41 and second substrate 42, and easy to position said substrates in the regular positions thereof.

Also, the guide portions 25 and 28 include the first guide portions 25 that are configured to guide the first substrate 41 and the second substrate 42 in the insertion direction, and the second guide portions 28 that are arranged on a side of the first guide portion 41 opposite to the open portion 33 and are configured to guide the second substrate 42 in the insertion direction.

This configuration makes it possible to improve the accuracy with which the second substrate 42 is guided, compared to a configuration in which the second guide portion 28 is not provided.

Also, the pair of opposing walls 22 are arranged along a board surface of the first substrate 41 or the second substrate 42 and oppose each other, and the pair of side walls 23 connect the pair of opposing walls 22, wherein the surface area (the space inside) of the open portion 33 is smaller than the surface area of the opposing walls 22.

Decreasing the surface area of the open portion 33 suppresses the intrusion of dust and the like through the open portion 33, but it becomes necessary to slidably insert the first substrate 41 or the second substrate 42 in a direction along the board surface of the first substrate 41 or the second substrate 42 when the first substrate 41 or the second substrate 42 is to be inserted, and therefore it is difficult to selectively accommodate the first substrate 41 and the second substrate 42, and to restrict the movement thereof. With the embodiment described above, even if the surface area of the open portion 33 is small, the configurations of the first substrate 41 and the second substrate 42 make it possible to restrict the movement of the selectively accommodated first substrate 41 or second substrate 42.

Also, the cover 50 includes the guide groove portion 53 that is configured to abut against the first substrate 41 or the second substrate 42 such that movement of the cover 50 in an attachment direction is guided.

In this way, it is possible to easily perform the tasks of attaching the cover 50 and positioning the first substrate 41 or the second substrate 42.

Other Embodiments

The technology disclosed in this specification is not limited to the embodiments described above with use of the foregoing description and drawings, and embodiments such as the following are also encompassed in the technical scope of this specification.

The embodiment described above includes both the first pressing protrusions 30 and the second pressing protrusions 36, but configurations are also possible in which only either the first pressing protrusions 30 or the second pressing protrusions 36 are included.

The first restricting portion 31 includes both the step portions 27A and the first pressing protrusions 30, but configurations are also possible in which only either the step portions 27A or the first pressing protrusions 30 are included.

The gaps between the pairs of groove walls 25B and 28B of the guide portions 25 and 28 become narrow towards the rear ends thereof, but there is no limitation to this. For example, the gaps between the pairs of groove walls 25B and 28B of the guide portions 25 and 28 may also be gaps of a fixed size.

The first guide portions 25 and the second guide portions 28 are provided in the configuration described above, but there is no limitation thereto, and configurations are also possible in which only the first guide portions 25 are provided, for example.

The cover 50 is provided with the guide groove portion 53 in the configuration described above, but configurations are also possible in which the cover 50 is not provided with the guide groove portion 53.

What is claimed is:

1. A substrate case that is tubular and includes a bottom, comprising:
   an open portion into which a first substrate and a second substrate that has a different size to the first substrate can be selectively inserted;
   a guide portion that is configured to guide movement of the first substrate and the second substrate in an insertion direction when the first substrate and the second substrate are selectively inserted through the open portion, wherein the guide portion includes a first guide portion that is configured to guide the first substrate and the second substrate in the insertion direction, and a second guide portion that is arranged on a side of the first guide portion opposite to the open portion and is configured to guide the second substrate in the insertion direction;
   a first restricting portion that is configured to restrict movement of the first substrate when the first substrate has been guided by the guide portion and inserted to a regular position; and
   a second restricting portion that is configured to restrict movement of the second substrate when the second substrate has been guided by the guide portion and inserted to the regular position.

2. The substrate case according to claim 1, wherein at least one of the first restricting portion and the second restricting portion includes a pressing protrusion that is configured to press against a board surface of the first substrate or the second substrate when the first substrate or the second substrate have been inserted to the regular position.

3. The substrate case according to claim 2, wherein the first restricting portion includes a step portion that protrudes in a step-wise manner from an inner surface of the substrate case and is configured to restrict movement of the first substrate in the insertion direction.

4. The substrate case according to claim 2, wherein the guide portion includes a pair of groove walls between which an edge portion of the substrates is to be inserted, and
   a gap between the pair of groove walls is narrower on a side distant from the open portion.

5. The substrate case according to claim 2, further comprising a pair of opposing walls that are arranged along a board surface of the first substrate or the second substrate and oppose each other, and a pair of side walls that connect the pair of opposing walls, wherein the surface area of the open portion is smaller than the surface area of the opposing walls.

6. The substrate case according to claim 1, wherein the first restricting portion includes a step portion that protrudes in a step-wise manner from an inner surface of the substrate case and is configured to restrict movement of the first substrate in the insertion direction.

7. The substrate case according to claim 6, wherein the guide portion includes a pair of groove walls between which an edge portion of the substrates is to be inserted, and
   a gap between the pair of groove walls is narrower on a side distant from the open portion.

8. The substrate case according to claim 6, further comprising a pair of opposing walls that are arranged along a board surface of the first substrate or the second substrate and oppose each other, and a pair of side walls that connect the pair of opposing walls, wherein the surface area of the open portion is smaller than the surface area of the opposing walls.

9. The substrate case according to claim 1, wherein the guide portion includes a pair of groove walls between which an edge portion of the substrates is to be inserted, and
   a gap between the pair of groove walls is narrower on a side distant from the open portion.

10. The substrate case according to claim 9, further comprising a pair of opposing walls that are arranged along a board surface of the first substrate or the second substrate and oppose each other, and a pair of side walls that connect the pair of opposing walls, wherein the surface area of the open portion is smaller than the surface area of the opposing walls.

11. The substrate case according to claim 1, further comprising a pair of opposing walls that are arranged along a board surface of the first substrate or the second substrate and oppose each other, and a pair of side walls that connect the pair of opposing walls, wherein the surface area of the open portion is smaller than the surface area of the opposing walls.

12. An electrical junction box comprising
    the substrate case according to claim 1,
    the first substrate or the second substrate that are configured to be accommodated in the substrate case, and
    a cover that closes the open portion.

13. The electrical junction box according to claim 12, wherein the cover includes a guide groove portion that is configured to abut against the first substrate or the second substrate such that movement of the cover in an attachment direction is guided.

14. The electrical junction box according to claim 12, wherein at least one of the first restricting portion and the second restricting portion includes a pressing protrusion that is configured to press against a board surface of the first substrate or the second substrate when the first substrate or the second substrate have been inserted to the regular position.

15. The electrical junction box according to claim 12, wherein the first restricting portion includes a step portion that protrudes in a step-wise manner from an inner surface of the substrate case and is configured to restrict movement of the first substrate in the insertion direction.

\* \* \* \* \*